United States Patent [19]

Morrison, Jr.

[11] 4,431,505

[45] Feb. 14, 1984

[54] HIGH RATE MAGNETRON SPUTTERING OF HIGH PERMEABILITY MATERIALS

[75] Inventor: Charles F. Morrison, Jr., Boulder, Colo.

[73] Assignee: Vac-Tec Systems, Inc., Boulder, Colo.

[21] Appl. No.: 508,927

[22] Filed: Jun. 29, 1983

Related U.S. Application Data

[63] Continuation-in-part of Ser. No. 408,233, Aug. 16, 1982, Pat. No. 4,391,697.

[30] Foreign Application Priority Data

May 3, 1983 [FR] France .................................. 83 07339

[51] Int. Cl.³ ............................................. C23C 15/00
[52] U.S. Cl. ................................ 204/298; 204/192 R; 204/192 M
[58] Field of Search ............................ 204/298, 192 R

[56] References Cited

U.S. PATENT DOCUMENTS

| 4,265,729 | 5/1981 | Morrison | 204/298 |
| 4,282,083 | 8/1981 | Kertesz et al. | 204/298 |
| 4,356,073 | 10/1982 | McKelvey | 204/298 |
| 4,361,472 | 11/1982 | Morrison | 204/298 |
| 4,370,217 | 1/1983 | Funaki | 204/298 |
| 4,391,697 | 7/1983 | Morrison et al. | 204/298 |
| 4,394,236 | 7/1983 | Robinson | 204/298 |
| 4,394,245 | 7/1983 | Homma et al. | 204/298 |

Primary Examiner—Arthur P. Demers
Attorney, Agent, or Firm—Gerald J. Ferguson, Jr.; Joseph J. Baker

[57] ABSTRACT

A magnetron sputtering apparatus for high permeable materials where the target may include first and second elements separated from one another by a gap and the magnetic field source preferably exceeds 1000 gauss adjacent a pole thereof. The source is preferably a solid, oriented crystal ferrite magnet. A number of different configurations are disclosed.

48 Claims, 18 Drawing Figures

FIG. 7A  FIG. 7B

HIGH RATE MAGNETRON SPUTTERING OF HIGH PERMEABILITY MATERIALS

CROSS REFERENCE TO RELATED APPLICATION

This application is a continuation-in-part of U.S. application Ser. No. 408,233, filed Aug. 16, 1982 and issued as U.S. Pat. No. 4,391,697 on July 5, 1983.

BACKGROUND OF INVENTION

The present invention relates generally to the art of forming thin films, and more particularly to improvements in the magnetron sputtering process and apparatus for forming such films which may be highly permeable materials.

One technique for depositing thin films of a desired material on a substrate is diode sputtering. A target comprising the material to be deposited, is bombarded by gas ions which have been accelerated by an intense electric field. The bombardment ejects atomic sized particles of the target which settle upon the substrate surface as a thin film. This sputtering process is slow compared to other techniques and the electric voltage required to produce a diode sputtered film is relatively high. The current saturates at a low value.

Disadvantages associated with the diode sputtering process have been alleviated to a large degree by the use of magnetron sputtering. As can be seen in FIG. 1A, an array of magnets 10 and 12 is positioned behind a low permeability target material 14 where the magnetron may produce a discharge of "racetrack" shape and where the magnets may be of the type disclosed in U.S. Pat. Nos. 4,162,954, 4,180,450 and 4,265,729, issued to Charles F. Morrison, Jr., which patents are incorporated herein by reference. Coupling plate 16 serves to short the magnetic fields between the two magnets at the lower portion thereof. Because of the low permeability of the target material, the magnetic lines of force 18 extend from the magnets and pass through the target material 14 and travel substantially parallel to the plane of the target surface for a certain distance. An electric field is established perpendicular to at least a portion of the magnetic field. Gas ions are accelerated by the electric field and strike target 14 causing it to eject atomic sized particles as in diode sputtering. However, the magnetic field above the target surface confines secondary electrons ejected from the target to the vicinity of the target surface and thus accelerates the rate of collisions between the secondary electrons and gas molecules of the gas plasma (generally argon). These additional collisions serve to generate additional gas ions and, hence, more gas plasma which is confined to the vicinity of the target surface. Thus, the deposition rate of magnetron sputtering over that of diode sputtering is increased by an order of magnitude.

It can be seen that the looping magnetic field as indicated by lines of force 18 is necessary to trap the plasma near the surface of target 14. However, if it is desirable to sputter a high permeability material with magnetron sputtering, the looping magnetic field will be short circuited as shown in FIG. 1B. Effectively the high permeability target 24 couples all of the magnetic lines of force from one magnet to the other just as does the coupling plate 16. The lack of the looping magnetic field 18 to trap the plasma in the vicinity of the high permeability target material would reduce the magnetron sputtering to that of ordinary diode sputtering with its attendant relatively slow sputter rate due to current saturation.

A number of solutions have been attempted to obtain magnetron sputtering of highly permeable materials with only limited success. In one embodiment, a very thin high permeability target is utilized so as to become saturated by the magnets and thus incapable of shunting all of the magnetic field. Unfortunately, if the targets are made thin enough such that the magnets do not shunt virtually all of the field, the targets are rapidly depleted before a film is accumulated on substantial quantities of receiving substrate. Other approaches are to utilize relatively normal target thicknesses but in conjunction with high strength magnets again serving to saturate the target material and maintain a weak magnetic field looping thereover. This generally requires at least a second set of magnets or an extremely powerful electromagnet. This works reasonably well with moderate sized targets of iron and nickel but is generally inadequate for Permalloy, samarium cobalt, and other very high permeability materials. This approach is generally described in my co-pending patent application Ser. No. 28,434, filed Apr. 9, 1979.

One further method of permitting magnetron sputtering is to reduce the strength of field required to saturate the target material. This can be accomplished by heating the target material to above its Curie point and this is discussed in U.S. Pat. No. 4,299,678 issued to Meckel on Nov. 10, 1981. However, none of the above methods lend themselves to serious industrial coating and thus most sputtering of highly permeable materials is still done by diode sputtering with its very low rates of accumulation.

SUMMARY OF THE INVENTION

In view of the above difficulties with sputtering of high permeability materials, it is an object of the present invention to provide a method and apparatus for high rate sputtering of highly permeable materials as well as non-permeable materials.

It is a further object of the present invention to provide a method and apparatus for high rate sputtering of permeable materials which does not require magnetic saturation of the target material either by intensive magnetic fields or by heating of the target material to above its Curie point temperature.

The above and other objects are achieved in accordance with the present invention by providing a two piece target with a gap between the pieces where a plasma source is disposed in the gap and a weak trapping field is provided over the target to retain the plasma in the vicinity of the target. If the target comprises a high permeability material, a magnetic field is applied through the target and the gap to establish the plasma source. Because of the gap, not all of the applied field passes through the target and the gap—that is, the remainder of the field, becomes the weak trapping field disposed over the target. In this manner, it is possible to sputter materials having very high permeabilities.

A further object of the invention is the provision of magnetrons which utilize a magnetic field source including solid, oriented crystal magnets such as samarium or strontium ferrite magnets for sputtering either permeable or non-permeable materials.

Other objects and advantages of this invention will be apparent from a reading of the following specification and claims taken with the drawing.

BRIEF DESCRIPTION OF THE DRAWINGS

A more complete appreciation of the invention, and many of the attendant advantages thereof, will be readily apparent by reference to the accompanying drawings, wherein:

FIG. 7A is a side cross-sectional view of the invention generally corresponding to FIG. 5;

FIGS. 7B and 7C are side cross-sectional views of further embodiments of the present invention.

DETAILED DESCRIPTION OF PREFERRED EMBODIMENTS

Figure 1A:
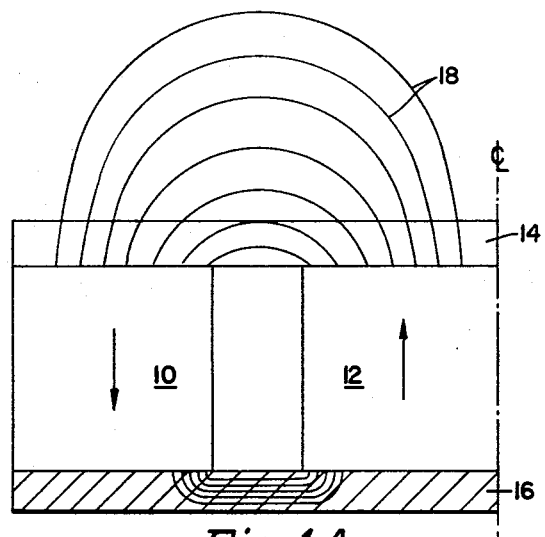
FIG. 1A is a side cross-sectional view of a typical prior art magnetron sputtering system.
Figure 1B:
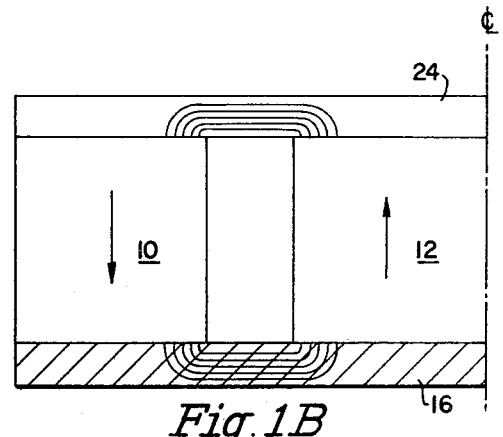
FIG. 1B is a cross-sectional view of a portion of the magnetron sputtering system in FIG. 1A with a high permeability target material.

Referring now more particularly to the drawings wherein like reference numerals designate like elements throughout the several views, it is understood the illustrated embodiments are all interconnected in the requisite pressure gas atmosphere which is conducive to plasma generation from the gas molecules present. The selection of a suitable gas, gas pressure, power supply voltage, cathode to anode spacing and location with respect to the substrate which is to be covered will be clear to those of ordinary skill in the art having reviewed the present disclosure.

Figure 2:
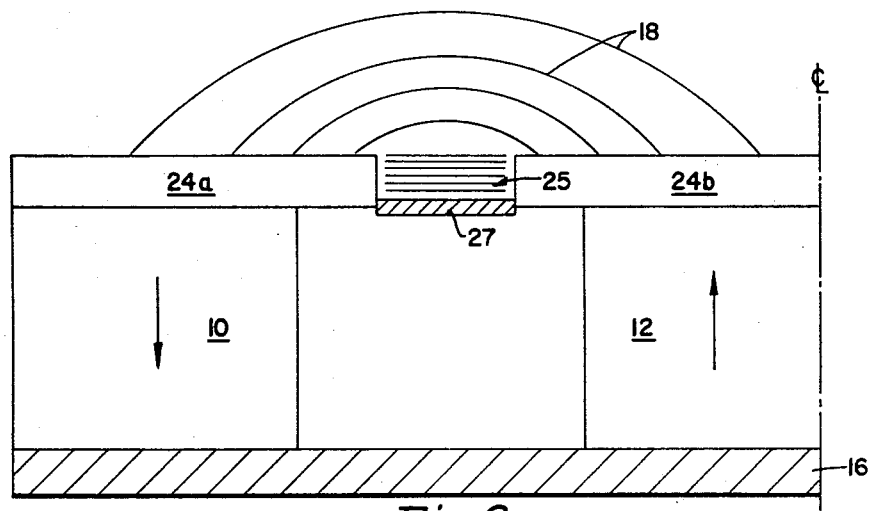
FIG. 2 is a cross-sectional view of a portion of the magnetron sputtering device in FIG. 1A but in accordance with the present invention.

FIG. 2 is a diagrammatic illustration of a cathode in accordance with the invention where the cathode may be of the well known "racetrack" type. The cathode includes first or outer cathode 24a and second or inner cathode 24b separated from one another by a gap 25. A field is illustrated in the gap which is parallel and of equal strength from side to side. Even though the field is between highly permeable blocks of material, it is no stronger than the usual magnetron field. That is, the field is only as strong as the driving magnets 10 and 12 underneath. In addition to generating the strong field in the gap 25, the magnets 10 and 12 also generate a weak looping field 18 over the target 24a, 24b.

As the distance above the gap 25 increases, the field strength drops rapidly below the required field strength of 80–100 gauss required for magnetron action in the FIG. 1A embodiment. Thus, it is clear the gap 25 is the primary plasma generator and the weak looping field overhead serves to contain the plasma adjacent the target elements where most target materials sputter at various power densities at from 1–25 microns of argon. Thus, the plasma generation function and the plasma use function are separated in the present invention. This is in contradistinction to the FIG. 1A arrangement where the field 8 is used both for plasma generation (to confine the ionizing electrons) and for plasma use (to confine the plasma which sputters the target). If the gap generates plasma too readily, the target might not develop sufficient acceleration sheath to cause sputtering. If plasma production is too sparce, saturation occurs or too high voltages are required. Gap geometry and operating pressure combine to give control over these relationships. The following rates have been measured and normalized to 67 watts/square inch at four inch target to substrate distance:

| Fe | |
|---|---|
| Ni | 4500 A/minute |
| Co | |
| Permallog (79% Ni, 4% Mo, 16+% Fe) | 3500 A/minute |

A floor for the gap is also provided with a floor 27 which may comprise either a thin permeable material such as the target material or a non-permeable material such as ceramic. It has been observed that the gap floor can sputter. Thus, if the floor is target material, the output of the cathode will not be contaminated. This adds to the complexity and must be done carefully to provide long lifetime without magnetically shorting the inner and outer targets together. However, as the width of the gap is reduced to achieve a practical minimum, the gap floor becomes less critical. At $\frac{1}{8}$ inch wide, a ceramic floor made almost no change in the operating characteristics. The ceramic was quickly coated to build some minor thickness with time. If the buildup becomes a problem such that the field in the gap would be shunted, the gap can be slightly widened, such that the net rate of buildup is very slow. It may be that extremely small gaps might not have a sufficient looping magnetic field to cause magnetron action as in one embodiment, a 1/16" wide gap would not operate.

Figure 3:
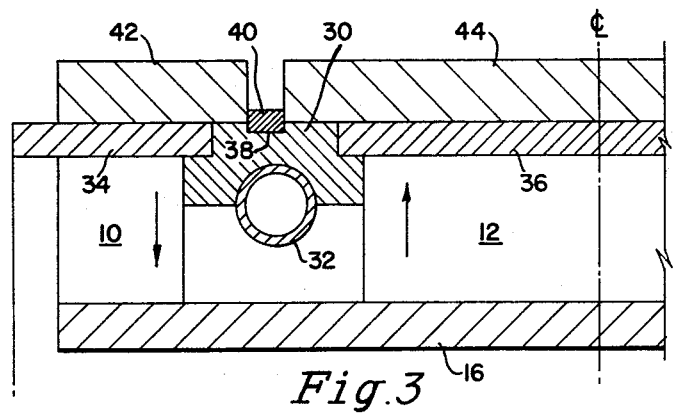
FIG. 3 is a side cross-sectional view illustrating how a commercially available magnetron sputtering system can be modified to operate in accordance with the present invention.

FIG. 3 illustrates a further embodiment of the present invention which can be retrofitted to an existing magnetron system manufactured and sold by Vac-Tec Systems, Inc., 2590 Central Ave., Boulder, Col. 80301. In FIG. 3, the highly permeable coupling plate 16 has a center magnet 12 mounted thereon. The outer magnet 10 is also mounted on the base coupling plate 16. A non-permeable high thermal conductivity coupler 30 is provided with a conventional water cooling tube 32 mounted thereon. The thermal conductivity coupler is brazed to highly permeable coupling plates 34 and 36 along their lines of contact. It can be seen that the magnetron is symmetrical across center line $C_L$ (as in the case in the other figures of the drawing) and that the pole piece 36 when viewed from above will be a flat circular, oblong or rectangular plate and that pole piece 34 will be a relatively flat circular, oblong or rectangular annulus. A groove 38 in high thermal conductivity coupler 30 is provided to accommodate ceramic floor and target separator 40. Finally, the two highly permeable target elements 42 and 44 are located on the coupling plates 34 and 36 and spaced apart by ceramic insert 40.

For most targets, except possibly nickel, the magnetic field can provide the target element hold down function such that no clamp is required. It is desirable that the bottom of the target pieces be ground flat for good heat and magnetic field transfer. The ceramic insert, in addition to preventing the outer target element 42 from being pulled into center target element 44, also makes it impossible to contaminate the cathode output by sputtering the thermal conductivity coupler 30. Loading and removing target elements requires some care. Because of the strength of magnet 12, center target element 44 is strongly bonded to coupling plate 36. It can only be removed after outer target element 42 and the ceramic separator have been removed. It may be most useful to make the outer target in a number of pieces such that when fully eroded on one side the pieces may be rotated end for end and used again.

Figure 4:
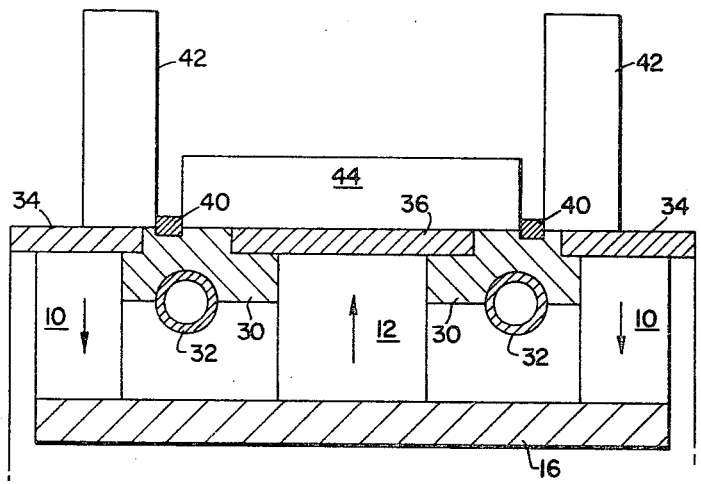
FIG. 4 is a side cross-sectional view of a further embodiment of the present invention.

FIG. 4 illustrates the same high rate sputtering apparatus as shown in FIG. 3 but in full cross-sectional view with a slightly different target element arrangement. The outer target elements 42 extend higher away from the coupling plates than does the center target element 44 and as a consequence are sputtered more heavily than in the FIG. 3 orientation. The distribution of sputtered material from the FIG. 4 cathode arrangement is more uniform over a wider substrate area than with the FIG. 3 embodiment. This appears to be due to the angularly directed material ejected from the upright sputtering surfaces of the outer target elements 42.

Figure 5:
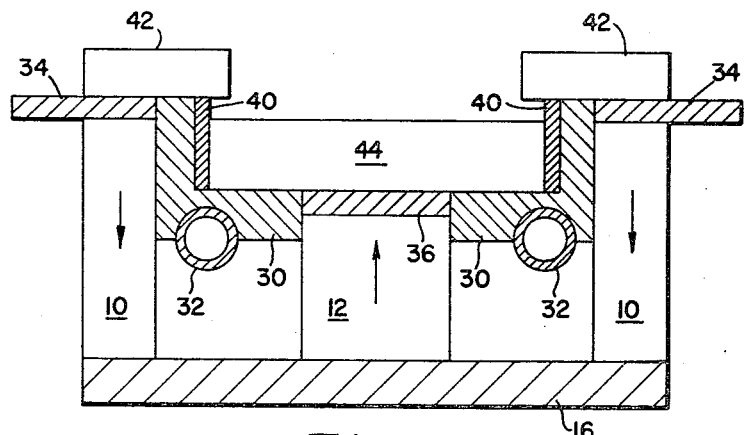
FIG. 5 is a side cross-sectional view of a further embodiment of the present invention.

FIG. 5 shows a further embodiment of the present invention in which the plasma generation is "hidden" from the substrate. The functional arrangement is similar to that in FIG. 3 with the exception that the ceramic insert 40 extends above the surface of the center target element 44 and spaces outer target element 42 therefrom. Thus, the plasma generating intense magnetic field would be in the area between the upper outer edge of center target element 44 and the lower inner edge of outer target element 42 with the weak plasma containment field looping between target elements 42 and 44. In this configuration, the ceramic back 40 on the generator gap is much less critical, for that area is very quickly coated by the low angle sputtering from the center target. This embodiment is more critical to thickness of the center target for the gap should be at least ⅛ inch.

It is also possible in the FIG. 5 embodiment to feed target material from the edge—that is, for example, portions 42 shown in FIG. 5 could be separate elements where the right portion 42 would be fed to the left while the left portion 42 would be fed to the right.

Figure 6:
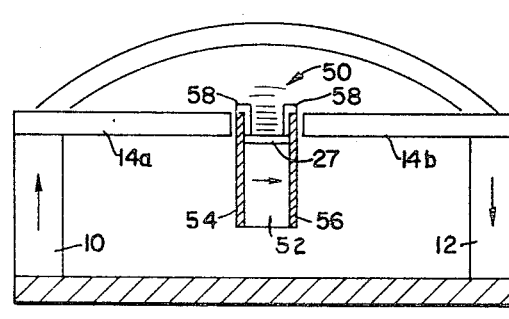
FIG. 6 is a side cross-sectional view illustrating the use of the present invention for plasma generation in a further sputtering arrangement.

Although the greatest advantage of the present invention is the ability to high rate sputter highly permeable materials, it can also be used to high rate sputter non-permeable target materials and still maintain the advantageous highly efficient plasma generation which characterizes the present invention. FIG. 6 illustrates an embodiment in which high rate sputtering of a non-permeable target can be achieved while maintaining the desirable plasma generator although this embodiment could also be used to sputter permeable materials. Conventional center and outer magnets 12 and 10, respectively, are located on coupling plate 16. The low permeability or non-permeable target material $14a, 14b$ is located on the magnets 10 and 12 with an annular gap 50 separating inner and outer target materials elements. Disposed beneath the gap is a magnet 52 for generating a strong magnetic field in the gap. Magnets 10 and 12 generate the desired weak field over the target $14a, 14b$. Permeable pole pieces 54 and 56 extend into the gap 50 to provide a strong field therein. It is this strong field which is responsible for the high rate of plasma generation. The pole pieces are preferably coated with layers 58 comprising the material of targets $14a, 14b$. Thus, the strong magnetic field created by pole pieces 54 and 56 in conjunction with magnet 52 will comprise a high rate plasma generator which will feed plasma up into the weak magnetron trapping field and thence down onto the non-permeable target elements $14a, 14b$ for sputtering thereof.

It should be appreciated both the center and outer target elements and all of the gap surfaces, with the exception of the FIG. 6 embodiment, are at the same electrical potential even though different processes are taking place. The difference between plasma generator and target areas is a matter of geometry and the nature of the magnetic field present. The cathodic plasma generators of FIGS. 2-5 undergo some sputtering of the gap surfaces, but because of the parallel faces much of the sputtered material is deposited on the opposite face. This is quite conservative of generator structure, but can cause slow recovery from oxide or other contamination of the generator. Recovery times of the FIG. 5 embodiment tends to be much shorter than that for the FIG. 3 embodiment.

The weak dome or trapping field and strong plasma generator combination of the present invention overcomes the high permeability barrier to high rate sputtering. The greater the permeability, the better the present invention works because it constructively uses the permeability, rather than fighting it. The invention at least in part separates the plasma generation and sputtering functions, a division that can enable optimization of both.

In general, any part of one pole-face target that can be made to direct lines of force toward the other and over the plasma source can be made to sputter by the trapped plasma. In much magnetron work, there is a concern about not connecting anode and cathode by lines of force because plasma might escape and sputtering might not be possible. As the plasma generation function is separated from the cathode function, this concern can also be eliminated.

The present invention may be seen as an example of the use of a plasma source operating into a relatively weak magnetic trap to keep a high plasma density next to the cathode. Without the magnetic trap (on other than the generator), bias sputtering would occur. The plasma generation can be with either an anodic or a cathodic generator. For example in the FIG. 6 embodiment, the generator will be cathodic if the layers 58 are at cathode (or target) potential while it will be anodic if these layers are at anode potential. The cathodic unit tends to sputter, and the anodic unit needs a good source of electrons. Thus, both have limitations.

In the more general case where the generator is not an integral part of either the cathode or the anode, there will be electrical control over the generator output so that current and voltage can be separately controlled.

This could be effected by providing a trapping field over the target with a plasma source removed from the target—that is, one not disposed in a gap in the target as in the present invention. Without this triode (or tetrode) control, it may not always be possible to obtain desired operating situations.

Reference now should be made to FIG. 7A, which generally corresponds to FIG. 5. The magnet 10 is preferably a solid, oriented crystal magnet such as a strontium ferrite or samarium ferrite magnet, the flux density of which typically exceeds 1000 gauss adjacent a pole face and which preferably exceeds 1200 gauss. These magnets are made by a number of manufacturers including Chuto of Japan, General Magnetics, Allen Bradley, and Arnold Engineering of the United States. The use of such magnets causes the gap 70 to become non-critical in dimension. Thus, the magnetron is quite operational at a gap width of one inch as well as at less than one-sixteenth of an inch. Moreover, the more powerful magnetic field 60 obtainable from these magnets reduces the gas pressure needed for operation down to one micron or less. Hence, the magnetrons using these magnets become fully pressure equivalent to magnetrons which employ other types of magnets. As will be brought out in more detail hereinafter, the solid, oriented crystal magnets employed in FIG. 7A do have certain shortcomings when employed with other magnetron configurations. However, as indicated above, when employed with the configurations of FIGS. 2–13, they perform exceptionally well. Generally, such magnetic field sources will be termed "solid, oriented crystal ferrite sources" hereafter.

In addition to the solid, oriented crystal magnets discussed above, other magnetic field sources such as alnico magnets or electromagnets may be employed as long as they are capable of generating a flux density of at least 1000 gauss at a pole face thereof. Generically, such sources will be termed "high flux density" sources hereinafter.

Another magnetic field source which may be used in the embodiment of FIGS. 2–13 comprises a plurality or stack of overlapping flexible strips where each strip preferably comprises an oriented ferrite impregnated plastic or rubber tape such as that manufactured and designated as PL-1.4H by the Minnesota Mining and Manufacturing Co. Even though this field source may be used, it suffers some disadvantages due to its lower flux of typically about 600 gauss. Thus, the gap dimension does become more critical and higher gas pressures are needed for operation. Nevertheless, for many applications, these shortcomings are readily tolerated. Moreover, this field source has certain advantages which will be further discussed below. Generally, such sources will hereafter be termed "flexible" field sources.

As can be appreciated in the embodiment of FIG. 7A, the upper target 42 constitutes a frame while the lower target constitutes a plate. In this embodiment as in all other embodiments of the invention, a DC or RF electric field may be applied from cathode to an anode (not shown) in any of a number of well known ways. In the embodiment of FIG. 7B, the situation is reversed and the upper target 64 is the center target while the lower target 62 may constitute a frame. The FIG. 7B embodiment possesses certain advantages with respect to the FIG. 7A embodiment. That is, a major problem encountered with strongly permeable target materials such as targets 44 and 62 is their relatively poor thermal conductivity. Thus, it is difficult to attain high rates of deposition for extended periods without the targets becoming red hot. Such temperatures exceed Curie temperatures and also increase the heat load to the substrate. Some designs can tolerate these temperatures while others stop sputtering with loss of permeability.

With the foregoing in mind, reference should be made to FIG. 7A where the gap 70 can be considered a gap outside target portion 44. Target portion 44 receives the majority of the power. This power is related to plasma trapped above the target area. Referring to the total cathode area consisting of targets 42 and 44, a large percentage of that area constitutes outside frame 42 and is weakly heated. For a given total power per total cathode area, this places a higher power density on the center target. Comparing this with the FIG. 7B embodiment, which has a center generator, a much smaller generator fraction of the cathode occurs. Thus, the power is dissipated over a large area of lower target 62 and the heat can be more easily removed. The lower target is the primary area eroded. The upper target 64 suffers net erosion only on the face surface 68 for Permalloy. Iron and cobalt/chromium tend to erode to some degree back onto the top of upper target 64. However, this is a slow erosion compared with the surface of lower target 62. Thus, upper target 64 will typically require replacement only after the depletion of several lower targets.

Narrowing the gap 70 to one-sixteenth inch decreases lower target erosion within the gap. Thus, closely fitting joints may be provided at 61 as indicated by the dotted lines in FIGS. 7A and 7B whereby the main portion of the lower target 44 or 62 may be replaced without removing the upper targets 42 or 64.

Layers 40 on the magnets may preferably comprise a thermally conductive material such as copper to facilitate heat removal. Since the target material deposits at the bottom of the gap at a rate greater than sputtering therefrom, there is little, if any, danger of contamination by the copper. Moreover, layer 40 may constitute a ceramic material or the target material. In case of the latter material, the layer should be very thin to prevent magnetic short circuiting between targets 42 and 44 or 62 and 64.

Figure 8A:
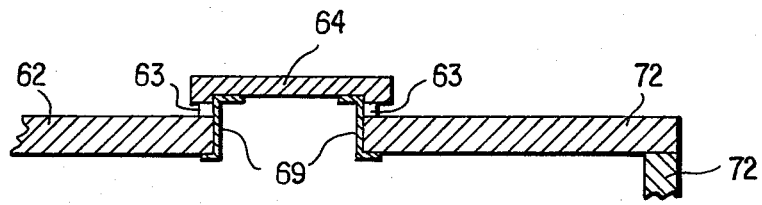
FIGS. 8A and 8B are side cross-sectional views of embodiments illustrating techniques for target cooling.
Figure 8B:
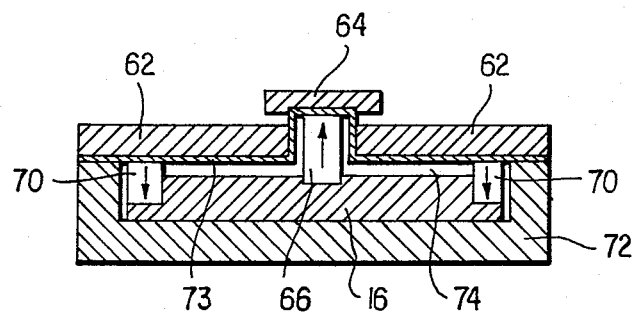

More effective target cooling can be provided by direct water contact with the underside of the targets 62 and 64 as shown in FIG. 8A. A copper cap 69 may be welded or soldered to the targets to contain the cooling water. A more complex arrangement is shown in FIG. 8B. However, this arrangement lessens water jeopardy in the vacuum system and increases the percentage of target that can be consumed. In this embodiment, a copper target holder 73 extends completely underneath targets 62 and 64. The water flow area is indicated at 74. Outer magnets 70 are also illustrated which assist magnet 66 where magnets 70 are also preferably of the solid, oriented crystal type discussed above. A copper or aluminum frame 72 is employed to complete the cathode structure. Water flow is critical under all of the target areas. The targets are typically within ⅛ to 3/16 inch of the magnet faces. The targets 62 and 64 are soldered to the copper target holder 73 to maximize their thermal contact.

The center upper target 64 should block as little as possible of the useful portion of the cathode output from target 62. Thus, it is desirable to narrow and lower upper target 64 such that it intercepts as little of the sputtered material as possible. Reduction of the height of gap 70 thus is important. Also, the narrower the gap, the less the chance of material being sputtered from the back of the gap. Some target material 63, see FIG. 8A, can be placed at the back of the gap so that there is no contamination from that source. In this regard, note the previous discussion with respect to layer 40 of FIGS. 7A and 7B. Quantitative measurements have been made of the heat reaching the substrate (not shown) from the center upper target system of FIG. 7B. At a 4" target to substrate distance, the substrate is heated by only about $\frac{1}{3}$ as much of the applied power as is the case of the vertical gap system of FIG. 2. This low substrate heat load makes this system particularly adaptable to the coating of the plastic substrates. A single gap, such as gaps 70 of FIGS. 7A and 7B, closing on itself about the target surface, provides all of the electrons and initial plasma needed to permit operation at low pressure and high power levels—even levels higher than that tolerable to the target cooling system. Multiple gaps may also be employed. Thus, the embodiments of FIGS. 7A and 7B may be combined where the magnet 66 may extend through the center of target 44 and where targets 42 and 64 would be retained. Such additional gaps multiply the electron and plasma loads, decreasing the cathode voltage. The operating voltage is somewhat lower than that of most magnetrons even when using a single gap. Significant lowering of the operating voltage could affect the sputter yield, reducing the effectiveness of the cathode for sputter coating.

Figure 7C:
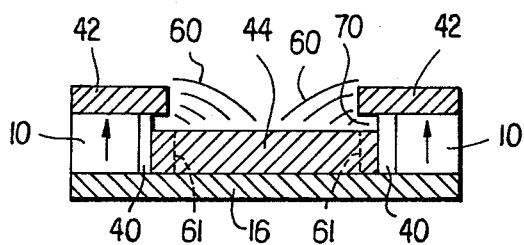
Figure 7C:
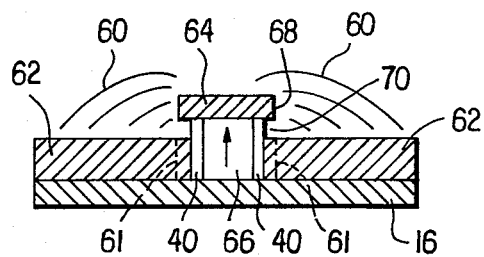
Figure 7C:
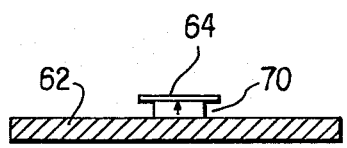

Referring to FIG. 7C, there is illustrated an embodiment of the invention which is related to that of FIG. 7B. In FIG. 7C, a single solid, oriented crystal ferrite magnet 66 is placed at the approximate center of target 62, the magnet being rather short and having a height of typically $\frac{1}{8}$ inch. Note this arrangement differs from the FIG. 7B arrangement in that, in FIG. 7B, a slot is provided in target 62 through which magnet 66 extends. Accordingly, this arrangement is convenient when a longer magnet is employed. Nevertheless, the FIG. 7C arrangement can also drive a most powerful cathode although it would not meaningfully operate without a permeable target.

Figure 9:
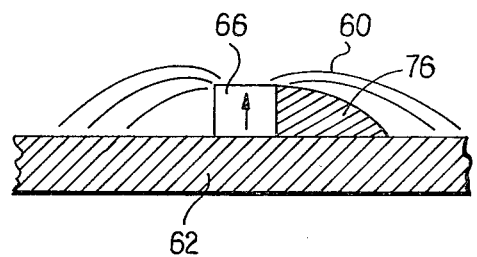
FIG. 9 is a side cross-sectional view of a further embodiment of the invention.

Referring to FIG. 9, a bare, solid, oriented crystal, ferrite, bar magnet 66 is positioned on top of a steel target 62. This creates a most complete discharge pattern with the ferrite bar 66 soon being coated with iron. It operates at high power and low pressure. As can be appreciated, this is related to the center target embodiments without the top target 64. There is no gap in the sense of the embodiments of FIGS. 7A–7C. However, there are rather strong magnetic loops that provide plasma generation close to the bar, and sufficient trapping for some distance. The cross-hatched area 76 close to the side of the magnet, serves as an efficient source. Even though the magnet is an insulator, it is quickly coated with metal and heated by ion bombardment.

Figure 10:
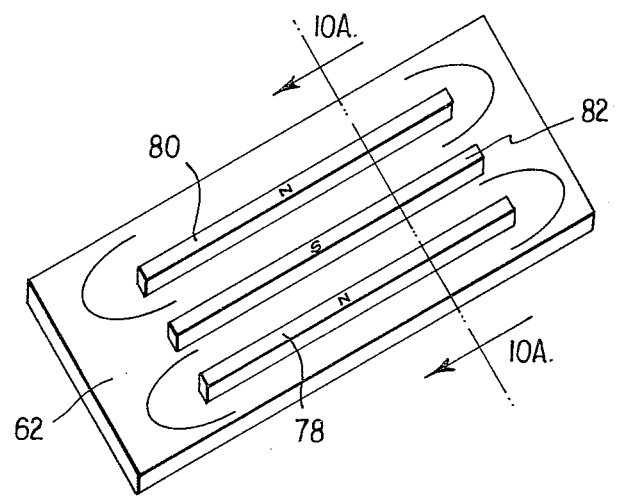
FIG. 10 is a perspective view of an illustrative multiple magnetron embodiment related to the embodiment of FIG. 9.
Figure 10A:
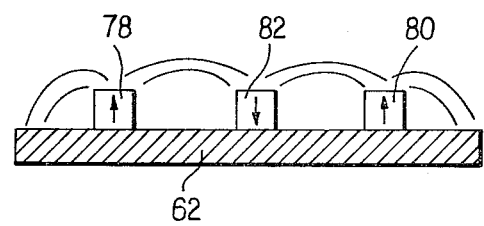
FIG. 10A is a cross-sectional view taken on the line A—A of FIG. 10.

Reference should now be made to FIGS. 10 and 10A where an illustrative multibar embodiment corresponding to the single bar embodiment of FIG. 9 is shown. A preferred embodiment is that shown in FIG. 10 where three bars 78–82 are disposed on plate 62, the bars being of alternate polarities. There are strong discharge rings about outside bars 78 and 80 and a very strong discharge between the bars. An ion filings diagram showed the field to be loops between the bars in the center. There was not a detectable independent discharge about the center bar. The outer loop systems appear to feed the center discharge such that it is very intense. Two bar combinations or spacings were tried but none of these had the stability and effectiveness of this three-bar unit of FIG. 10. It is apparent the FIG. 10 unit is not an open-ended magnetron; rather, it was three magnetrons working together.

Figures 11, 12:
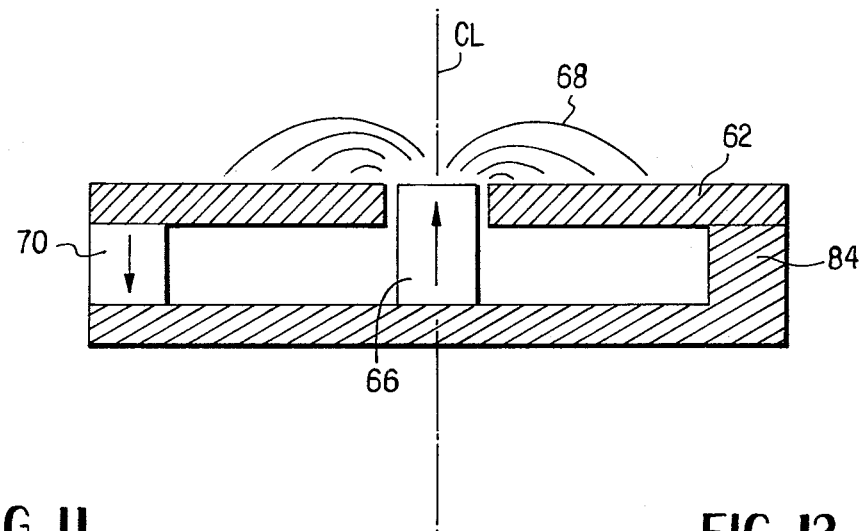
FIGS. 11 and 12 are cross-sectional views of further embodiments of the invention.

Lowering a magnet into the target, as shown in FIGS. 11 and 12 is also very effective—provided that magnet 66 had crystal orientation such that it could project field above the surface of target 62. The source system was very close to the center magnet of FIG. 9, but the sputter activity was a broad pattern. As shown in FIG. 11, additional magnets 70 can be used under target 62, or as in FIG. 12, a permeable coupler 84 can be employed. Note FIG. 11 shows the left half of a symmetrical figure of revolution about center line CL while FIG. 12 shows the right half of such a figure.

As indicated above, the solid, oriented crystal magnets 64 and 70 discussed hereinbefore are particularly suitable for use with permeable targets in various configurations as discussed with respect to FIGS. 7A through 10. However, these magnets have not been extensively used in sputtering non-permeable targets since they do not have the ability to project a field a great distance. Thus, a 5 inch wide standard form magnetics on a steel plate with frame about the edge of one polarity and a row of reverse polarity down the center will not operate with a non-permeable target when the above, solid, oriented crystal ferrite magnets are used as a field source. However, it has been determined by applicant that in narrow arrangements (e.g., 1$\frac{1}{2}$ inch wide target) where the flux cannot easily get back to the base plate between magnets that a significant flux can be attained upward through a regular, non-permeable target using the solid, oriented crystal ferrite magnets.

Figure 13:
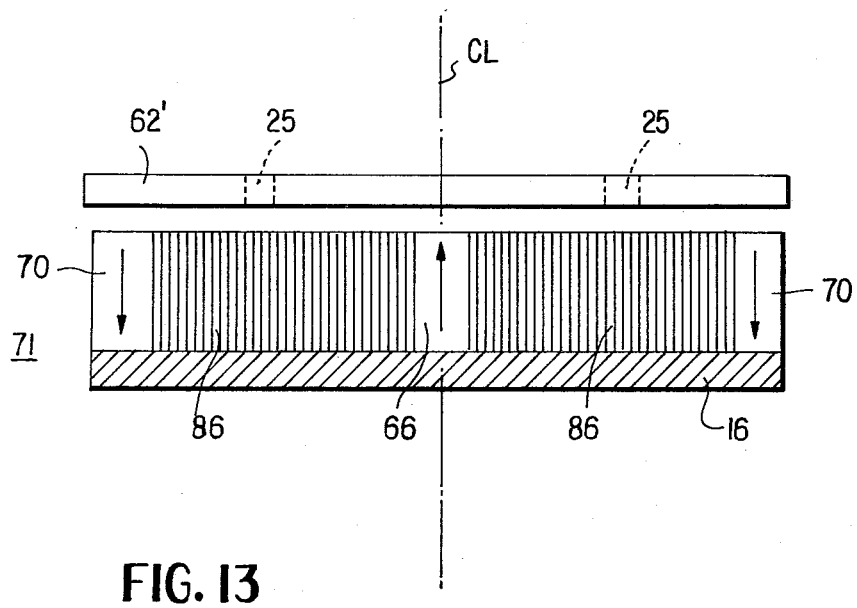
FIG. 13 is a cross-sectional view of a further embodiment of the invention.

Reference should now be made to FIG. 13, which illustrates a magnetic field source 71 comprising a combination of solid, oriented crystal magnets 70 and flexible magnets 86. The target 62' may either be non-permeable or permeable target with a gap 25, as indicated in dotted lines, such as a vertical gap as shown in FIG. 2.

Magnetic field source 71 is particularly advantageous if target 62' is permeable with a gap and if it happens to accidently overheat and exceed the Curie temperature. Above this temperature, the target effectively becomes non-permeable or at least not significantly permeable. Accordingly, if source 71 comprised only solid, oriented crystal magnets, the field would no longer be of a form that high rate sputtering could continue due to the inability of such magnets to project the field a great distance.

The FIG. 13 embodiment overcomes this problem by providing both the solid, oriented crystal magnets 66 and 70 which provide the very high flux levels which are very effective in operating the target in its intended cool mode below the Curie temperature and the flexible magnets 86 which can project the field long distances to thus effect standard magnetron operation if the target should accidently overheat and become non-permeable. Of course, the source 71 may also be used with targets which are inherently non-permeable. The field of flexible magnet 86 is not significantly shunted by permeable base plate 16 for the material of the flexible magnet is not highly permeable.

The FIG. 13 magnetic field source 71 can be used to provide a very effective narrow non-permeable target magnetron. For example, three and one half inch wide target cathodes have been produced using this system. These perform at less that one micron of argon at full power.

Thus, in view of the above teachings, many modifications and applications of this invention will become obvious to those of ordinary skill in the art. Different types of magnets (permanent, electro, etc.), materials, ionizing gases, field and magnetic orientations could be utilized depending on the particular characteristics of sputtering which are desired. Thus, the present invention is not limited to the embodiments and examples discussed herein and are limited only in accordance with the appended claims.

I claim:

1. Sputtering apparatus comprising
   a target of material to be sputtered;
   an anode;
   means for generating an electric field between the anode and target; and
   a magnetic field source for generating a magnetic field to confine plasma adjacent the target, the source including a solid, oriented crystal magnet having a flux density adjacent a pole thereof of at least about 1000 gauss.

2. Apparatus as in claim 1 where said target consists essentially of a magnetically permeable material.

3. Apparatus as in claim 2 where said target includes at least first and second target elements spaced from one another by a gap.

4. Apparatus as in claim 3 wherein said first target element is annular and the second target element is disposed at least adjacent the open portion of the annular first target element.

5. Apparatus as in claims 3 or 4 where said first and second target elements are co-planar.

6. Apparatus as in claims 3 or 4 where said first and second target elements are disposed in different planes.

7. Apparatus as in claim 4 where said first and second target elements are perpendicularly disposed with respect to one another.

8. Apparatus as in claim 7 where said second target element is disposed within the open portion of the first element.

9. Apparatus as in claims 3 or 4 where said first and second target elements are disposed in different, parallel planes.

10. Apparatus as in claim 9 where the gap between said first and second elements extends between the inner, lower periphery of said first element and the outer, upper periphery of the second element.

11. Apparatus as in claim 9 where the gap between said first and second elements extends between the outer, lower periphery of the second element and the inner, upper periphery of the first element.

12. Apparatus as in claim 11 where said solid, oriented crystal magnet extends through the open portion of the annular first target element.

13. Apparatus as in claim 12 where said magnet contacts said second target element.

14. Apparatus as in claim 12 where said magnet has a layer of thermally conductive material disposed thereon to facilitate removal of heat.

15. Apparatus as in claims 10 or 11 where a joint is provided in the lower target element adjacent the gap to facilitate removal of the lower element from the apparatus without moving the upper target element.

16. Apparatus as in claim 3 where said first target element comprises a plate, said solid, oriented crystal ferrite magnet is disposed on said plate, and said second target element comprises a cap disposed on the magnet, said gap extending between the outer, lower periphery of the cap and exposed portion of the plate adjacent the magnet.

17. Apparatus as in claim 2 where said solid, oriented crystal ferrite magnet has an elongated configuration and is lengthwise disposed on the surface of the target where the flux direction in the magnet is substantially perpendicular to the target surface.

18. Apparatus as in claim 17 where said target is a plate of symmetrical configuration and said magnet is a bar magnet centrally disposed on said plate.

19. Apparatus as in claim 17 including a plurality of said magnets of elongated configuration where each magnet is lengthwise disposed on the target and the flux therein is substantially perpendicular to the target surface.

20. Apparatus as in claim 19 including three of said magnets disposed in parallel on said target where the flux in the outer two magnets is oppositely directed to that in the inner magnet.

21. Apparatus as in claim 2 where said target has an opening and said solid, oriented crystal ferrite magnet extends through said opening.

22. Apparatus as in claim 2 where the upper surface of said magnet is substantially parallel to the upper surface of the target.

23. Apparatus as in claims 17, 19, or 21 including coupling means disposed adjacent the lower surface of the target for coupling the magnetic field back to said solid, oriented crystal ferrite magnet.

24. Apparatus as in claim 23 where said coupling means includes a further solid, oriented crystal ferrite magnet.

25. Apparatus as in claim 23 where said coupling means includes a permeable coupler.

26. Apparatus as in claim 1 where said target includes a plurality of target elements spaced from one another by a plurality of gaps.

27. Apparatus as in claim 1 were said magnetic field source includes a flexible source comprising a stack of overlapping strips where each strip comprises an oriented ferrite impregnated in a flexible binder.

28. Apparatus as in claim 27 including first and second solid, oriented crystal ferrite magnets disposed beneath the target respectively at the edge and central portions thereof where the fluxes in said first and second magnets are oppositely directed and are both perpendicular to the lower surface of the target and where said flexible source is disposed between said first and second magnets, the flux in said flexible source being substantially perpendicular to that in said first and second sources.

29. Apparatus as in claims 27 or 28 where said target consists of an essentially non-permeable material.

30. Apparatus as in claim 29 where the width of said target is no greater than about 3½ inches.

31. Apparatus as in claims 27 or 28 where said target consists essentially of a magnetically permeable material.

32. Apparatus as in claim 1 where said target consists of an essentially magnetically permeable material and the width of said target is no greater than about 1½ inches.

33. Sputtering apparatus comprising
   a target of material to be sputtered where said target consists essentially of a magnetically permeable material, said target including at least first and second elements spaced from one another by a gap;
   an anode;

means for generating an electric field between the anode and target; and means for generating a magnetic field to confine at least some of said plasma adjacent the target.

34. Apparatus as in claim 33 where said means for generating the magnetic field includes a magnet, the flux density of which is at least about 1000 gauss adjacent a pole thereof.

35. Apparatus as in claim 34 where said magnet is a solid, oriented crystal ferrite magnet.

36. Apparatus as in claim 34 where said magnet is an alnico magnet.

37. Apparatus as in claim 34 where said magnet is an electromagnet.

38. Apparatus as in claims 33 or 34 where said first target element is annular and the second target element is disposed at least adjacent the open portion of the annular first target element.

39. Apparatus as in claim 38 where said first and second target elements are disposed in different, parallel planes.

40. Apparatus as in claim 39 where the gap between said first and second elements extends between the inner, lower periphery of said first element and the outer, upper periphery of the second element.

41. Apparatus as in claim 39 where the gap between said first and second elements extends between the outer, lower periphery of the second element and the inner, upper periphery of the first element.

42. Apparatus as in claim 41 where said solid, oriented crystal magnet extends through the open portion of the annular first target element.

43. Apparatus as in claim 42 where said magnet contacts said second target element.

44. Apparatus as in claim 43 where said magnet has a layer of thermally conductive material disposed thereon to facilitate removal of heat.

45. Apparatus as in claim 40 where a joint is provided in the lower target element adjacent the gap to facilitate removal of the lower element from the apparatus without moving the upper target element.

46. Apparatus as in claim 41 where a joint is provided in the lower target element adjacent the gap to facilitate removal of the lower element from the apparatus without moving the upper target element.

47. Apparatus as in claims 33 or 34 where said first target element comprises a plate, said magnet is disposed on said plate, and said second target element comprises a cap disposed on the magnet, said gap extending between the outer, lower periphery of the cap and exposed portion of the plate adjacent the magnet.

48. Apparatus as in claims 33 or 34 where said target includes a plurality of target elements spaced from one another by a plurality of gaps.

* * * * *